US008752228B2

(12) United States Patent
Farkas et al.

(10) Patent No.: US 8,752,228 B2
(45) Date of Patent: Jun. 17, 2014

(54) APPARATUS FOR CLEANING OF CIRCUIT SUBSTRATES

(75) Inventors: Janos Farkas, Saint Ismier (FR); Srdjan Kordic, Biviers (FR); Sebastien Petitdidier, Gieres (FR); Kevin E Cooper, Weatherford, TX (US); Jan Van Hassel, Crolles Cedex (FR)

(73) Assignee: Freescale Semiconductor, Inc., Austin, TX (US)

( * ) Notice: Subject to any disclaimer, the term of this patent is extended or adjusted under 35 U.S.C. 154(b) by 1200 days.

(21) Appl. No.: 11/912,126

(22) PCT Filed: Apr. 20, 2005

(86) PCT No.: PCT/EP2005/005552
§ 371 (c)(1),
(2), (4) Date: Oct. 19, 2007

(87) PCT Pub. No.: WO2006/111193
PCT Pub. Date: Oct. 26, 2006

(65) Prior Publication Data
US 2008/0271274 A1    Nov. 6, 2008

(30) Foreign Application Priority Data

Apr. 20, 2005   (WO) ................. PCT/EP2005/005552

(51) Int. Cl.
*H01L 21/00*        (2006.01)
(52) U.S. Cl.
USPC ................................................ 15/77; 15/102
(58) Field of Classification Search
USPC ......... 15/77, 88.2, 102, 97.1, 88.1–88.3, 21.1
IPC .................................... H01L 21/00; B08B 1/04
See application file for complete search history.

(56) References Cited

U.S. PATENT DOCUMENTS

| 4,744,833 | A |   | 5/1988 | Cooper et al. |
| 5,483,717 | A | * | 1/1996 | Chikaki ............................. 15/3 |
| 5,589,001 | A |   | 12/1996 | Maeda et al. |
| 5,862,560 | A | * | 1/1999 | Jensen et al. ...................... 15/77 |
| 5,884,640 | A |   | 3/1999 | Fishkin et al. |
| 6,059,888 | A | * | 5/2000 | Hillman ............................. 134/6 |
| 6,616,516 | B1 |   | 9/2003 | Ravkin et al. |

(Continued)

FOREIGN PATENT DOCUMENTS

| JP | 54-99374  A | 6/1979 |
| JP | 63-316441 A | 12/1988 |

(Continued)

*Primary Examiner* — Monica Carter
*Assistant Examiner* — Stephanie Berry

(57) ABSTRACT

Silicon wafers and the like are cleaned using new scrubber-type apparatus in which measures are taken to compensate for differential cleaning of the central region of the wafer by: using rotary brushes having one or more non-contact portions arranged in the section thereof that faces the central region of the substrate, or toggling the relative position of the wafer and the rotary brushes, or directing cleaning fluid(s) preferentially towards the central region of the wafer. Another aspect of the invention provides scrubber-type cleaning apparatus in which the rotary brushes are replaced by rollers (110). A web of cleaning material (116) is interposed between each roller and the substrate. Various different webs of cleaning material may be used, e.g. a length of tissue, a continuous loop of cleaning material whose surface is reconditioned on each cleaning pass, adhesive material provided on a carrier tape, etc.

14 Claims, 9 Drawing Sheets

(56) References Cited

U.S. PATENT DOCUMENTS

| | | | |
|---|---|---|---|
| 7,007,333 B1 * | 3/2006 | Mikhaylichenko et al. | 15/77 |
| 7,115,023 B1 * | 10/2006 | Owczarz | 451/44 |
| 2001/0022008 A1 | 9/2001 | Dickey et al. | |
| 2003/0061675 A1 * | 4/2003 | Sugarman | 15/77 |
| 2006/0096048 A1 * | 5/2006 | Mikhaylichenko et al. | 15/77 |

FOREIGN PATENT DOCUMENTS

| | | |
|---|---|---|
| JP | 3-165902 A | 7/1991 |
| JP | 3-88330 | 12/1991 |
| JP | 6-304537 A | 11/1994 |
| JP | 11-176790 | 2/1999 |
| JP | 11-347499 | 12/1999 |
| JP | 2000-77379 A | 3/2000 |
| JP | 2000-305402 A | 11/2000 |
| JP | 2001-15896 A | 1/2001 |
| JP | 2001-512902 A | 8/2001 |
| JP | 2001-358110 | 12/2001 |
| JP | 2002-23143 A | 1/2002 |
| JP | 2002-506100 A | 2/2002 |
| JP | 2003-163196 A | 6/2003 |
| WO | 0003419 A2 | 1/2000 |
| WO | 0046841 A1 | 8/2000 |
| WO | 2006/111193 A1 | 10/2006 |

* cited by examiner

APPARATUS FOR CLEANING OF CIRCUIT SUBSTRATES

The present invention relates to the field of the manufacture of circuit devices and, more particularly, to the field of cleaning circuit substrates.

When circuit devices are fabricated it is often necessary to clean the substrate on which the circuit devices are being formed and/or mounted. Cleaning of the circuit substrate is particularly important in the case of the manufacture of integrated circuit devices on a semiconductor substrate.

It is necessary to perform numerous cleaning steps during the manufacture of integrated circuit devices on a semiconductor substrate (e.g. on a silicon wafer). In these cleaning processes it is generally desired to remove foreign matter such as trace metals and particles from the surface layer(s) carried on the semiconductor substrate, without damaging structures already formed on that surface (or those surfaces). The nature and strength of the forces holding the foreign matter on the surface vary. The cleaning process is particularly challenging in the case of a cleaning step performed after chemical mechanical planarization (CMP), especially after metal CMP.

Conventionally, various wafer-cleaning processes (including post-CMP wafer-cleaning) are performed using an apparatus known as a scrubber which includes one or more brush stations. FIG. 1 illustrates a typical brush station arrangement which enables both major surfaces of a semiconductor wafer to be cleaned at the same time.

As shown in FIG. 1, the wafer, W, is positioned between and makes direct contact with a pair of scrubber brushes, 1, whose outer surfaces are made from a polymer material such as polyvinyl acetate (PVA). Cleaning fluids are applied in order to help the cleaning of the brushes and wafer. These cleaning fluids are either dripped onto the wafer and/or the brushes, sprayed on the wafer, or supplied through the brushes themselves. The cleaning fluid will generally be a speciality chemical designed for the particular application. These chemicals are generally aqueous in nature, typically based on an organic acid (citric acid, oxalic acid, etc.) or an organic base (notably TMAH), with a molarity well below 0.1 M at the wafer's surface. The brushes are generally connected to a steady flow of deionized water, and the chemicals are supplied when a wafer passes the cleaning tool or during brush cleaning cycles.

In a conventional scrubber-based cleaning process, the semiconductor substrate (here a wafer, W) rotates about its own axis and the scrubber brushes, 1, rotate about their respective axes. As the wafer and the scrubber brushes rotate, particles on the wafer surface are dislodged by mechanical action of the scrubber brushes and/or the chemical action of the solution. The fluid dynamics of the chamber then remove the dislodged particles from the wafer surface. If suitably chosen, the cleaning chemicals can also assist the cleaning by tuning the zeta-potential of the particles and the materials on the wafer surface in such a way that they repel each other, making particle-removal easier. Moreover, again by suitable choice of cleaning fluids, it is possible to lift-off particles by very light etching of the wafer surface. In addition, the cleaning should be efficient to remove and inhibit the re-deposition of metallic species on the dielectric surface. These help to reduce electrical surface leakage of finished integrated circuits manufactured on the wafer.

In the arrangement of FIG. 1, the wafer is oriented vertically and so this scrubber arrangement is referred to as a "vertical configuration". Horizontal configurations are also used.

The conventional scrubber-type cleaning arrangement of the prior art presents a number of disadvantages.

Firstly, consideration of the conventional arrangement shown in FIG. 1 shows that the way in which the wafer is scrubbed differs depending upon the radial position on the wafer. More particularly, the centre of the wafer, W, is in continuous contact with the scrubber brushes, 1, whereas the periphery of the wafer only makes intermittent contact with the scrubber brushes. The graph of FIG. 2 illustrates approximately how the fraction of the time that the wafer spends in contact with the brush varies with the radial position on the wafer. Furthermore, the fluid dynamics caused by the rotation of the wafer and the scrubber brushes causes the cleaning fluids to operate differently on the central region of the wafer as compared to the other regions on the wafer.

As a result of the above processes, there is a gradient in cleaning condition across the radial direction of the wafer, with the centre of the wafer having a different degree of cleaning than the edge of the wafer. This leads to an increase in the frequency of occurrence of certain defects in the central portion of the wafer, notably dendrites and corrosion for Cu CMP processes. Scrubbing after other processes may result in similar higher levels of defectivity at the centre of the wafer, or the opposite (where the centre is better cleaned than the edge). This effect is illustrated in FIG. 3 which shows a map of defects on a wafer after a post-CMP cleaning process using a traditional scrubber configuration.

FIG. 3A shows an image of a whole wafer that has been cleaned using conventional scrubbing apparatus. In the image of FIG. 3A the speckles represent defects that have been located by a defect inspection tool. FIGS. 3B, 3C and 3D show close-up images of the central portion of the wafer and illustrate corrosion defects that are seen only at this central portion.

Secondly, the same scrubber brushes are used to clean a succession of different wafers. As time goes on, the brushes gradually accumulate particles and begin to re-deposit them on the next wafers being cleaned. This accumulation and re-deposition occurs despite the fact that the brushes are flushed with cleaning fluids and/or deionized water when no wafer is present in the cleaning station, and occurs even if the outer surfaces of the brushes are made from material which does not absorb fluids (in an attempt to prevent absorption of fluids laden with particles). Moreover, particles can become embedded in the brush surface and will then cause scratching of wafers undergoing cleaning.

Finally, from time to time it is necessary to change the brushes. This can involve lengthy down-time of the cleaning apparatus, for example because of the need to recalibrate the inter-roller spacing.

The present invention has been made in view of the above-described problems.

The present invention provides a cleaning method and a cleaning apparatus as described in the accompanying claims.

Features and advantages of the present invention will become clear from the following description of various preferred embodiments thereof, given by way of example, with reference to the accompanying drawings, in which:

FIG. 1 schematically illustrates a conventional scrubber-based device for cleaning semiconductor wafers;

FIG. 3 illustrates defects on a semiconductor wafer that has undergone post-CMP cleaning using a conventional wafer-cleaning device as illustrated in FIG. 1, in which:

FIG. 4 illustrates a preferred embodiment of brush for use in a scrubber-type wafer-cleaning device according to a first aspect of the present invention, in which:

FIG. 5 shows different configurations of brush surface useable in a scrubber-type wafer-cleaning device according to a first aspect of the present invention, in which:

Figure 6:
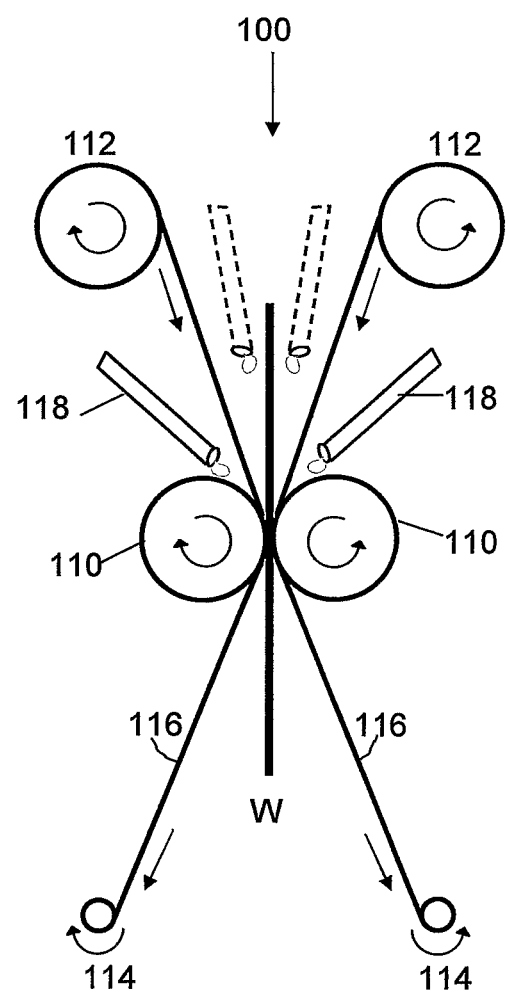
Figure 7:
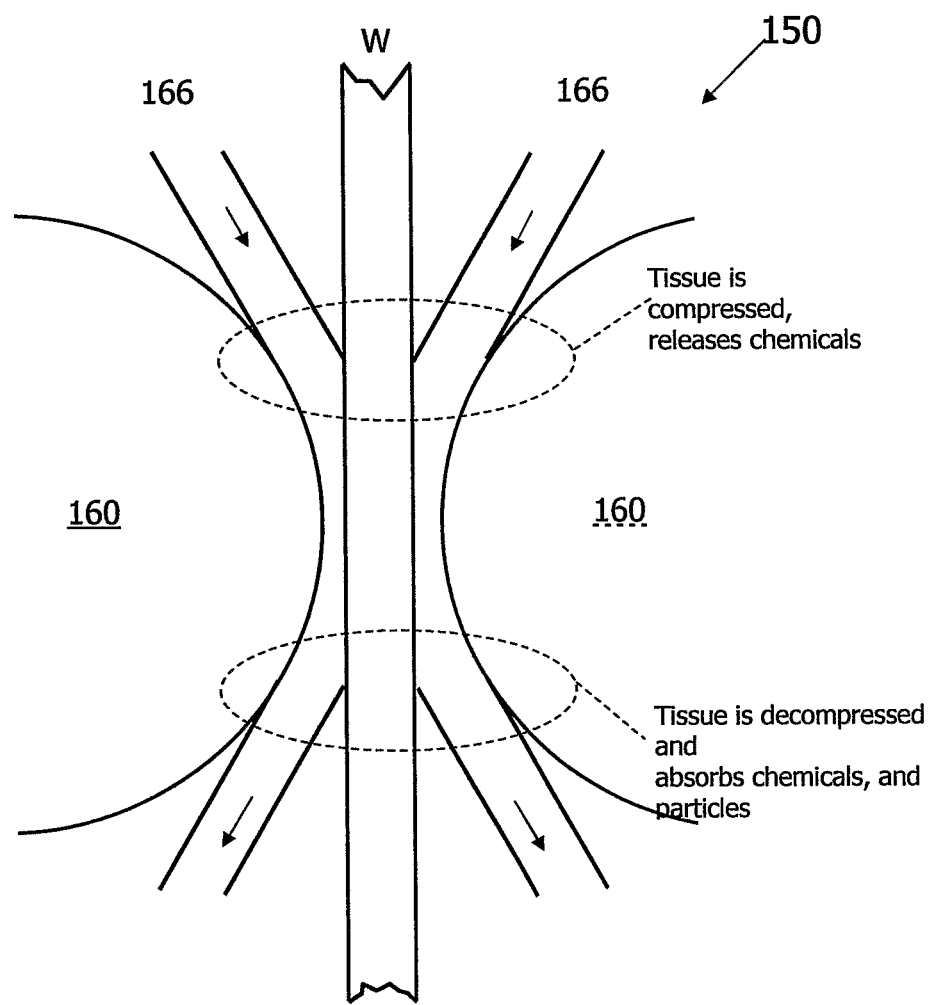
Figure 8:
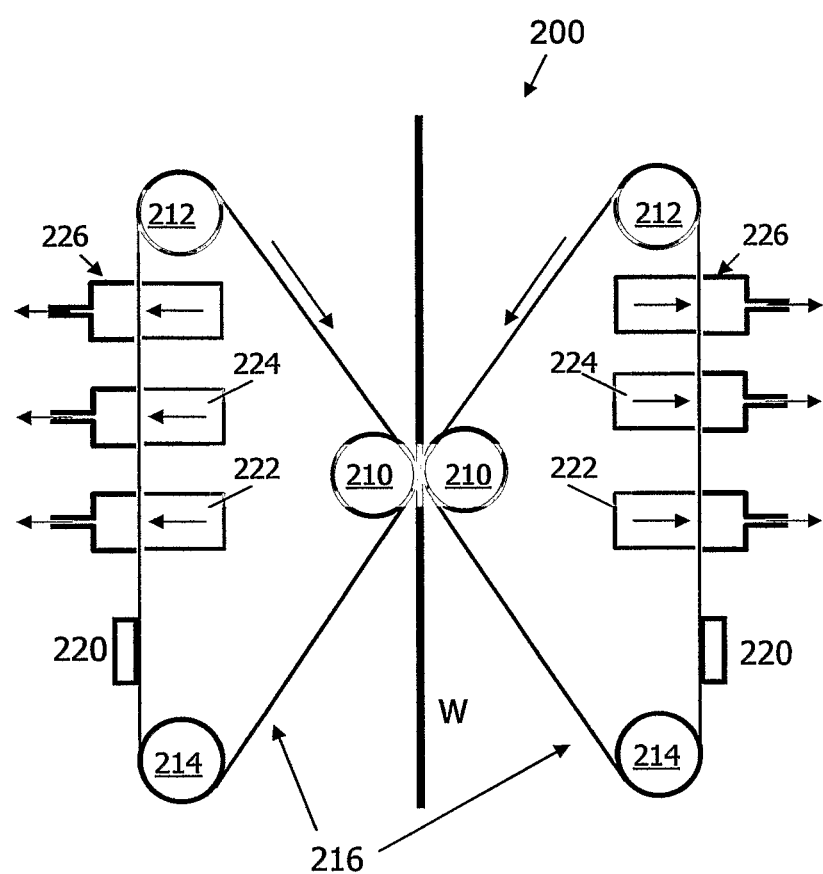
Figure 9:
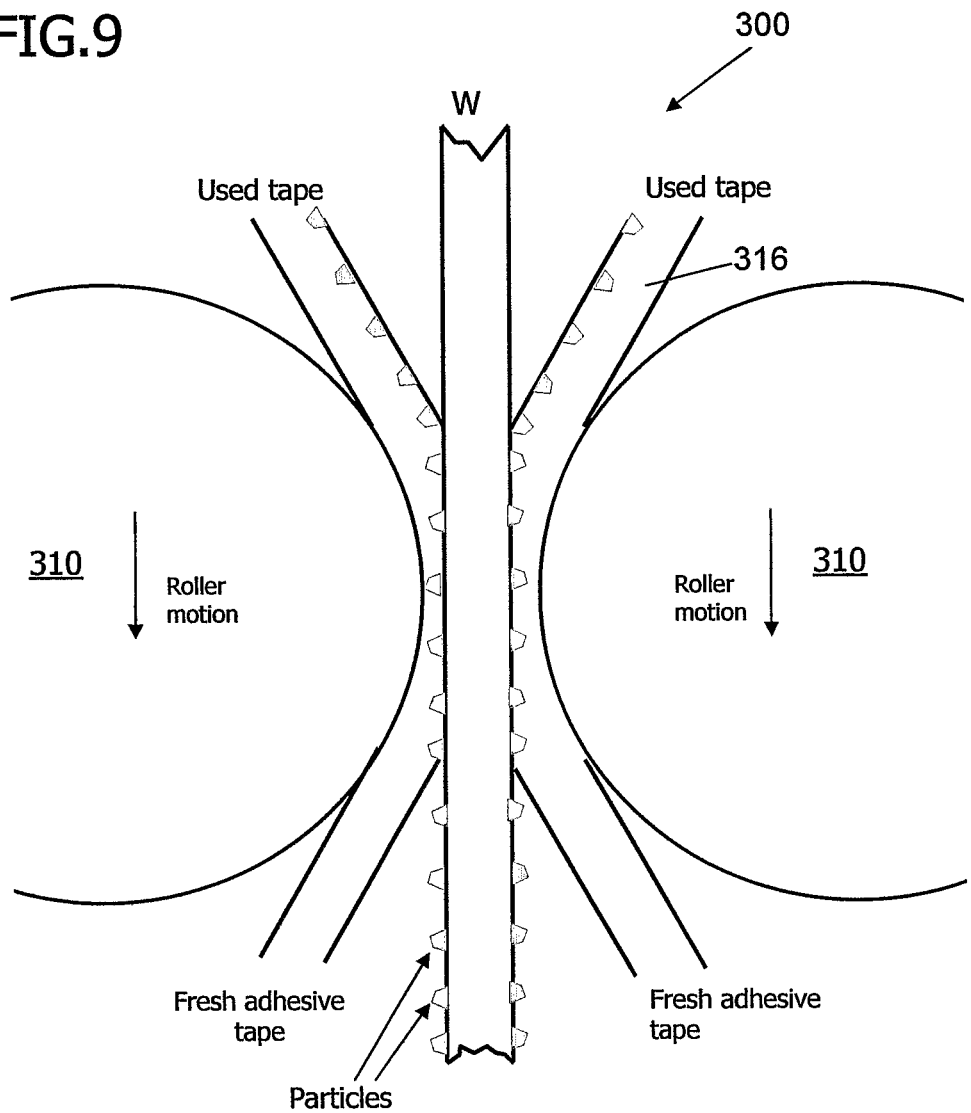
Figure 10A:
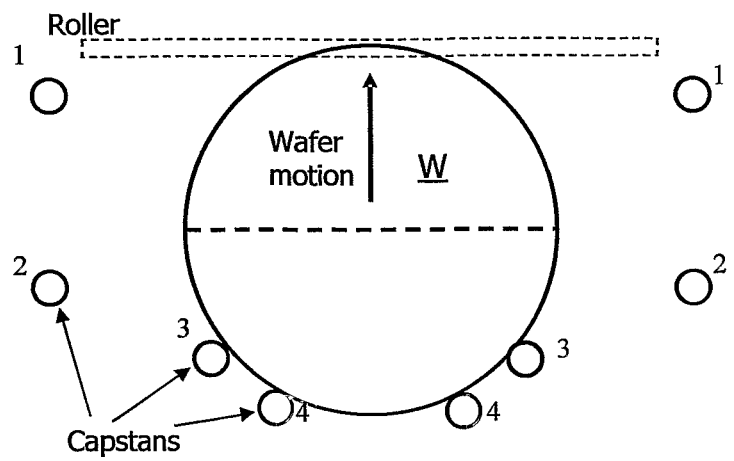
Figure 10B:
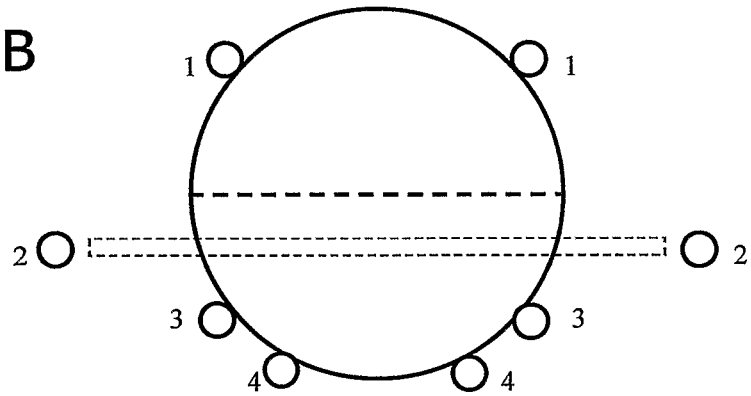
Figure 10C:
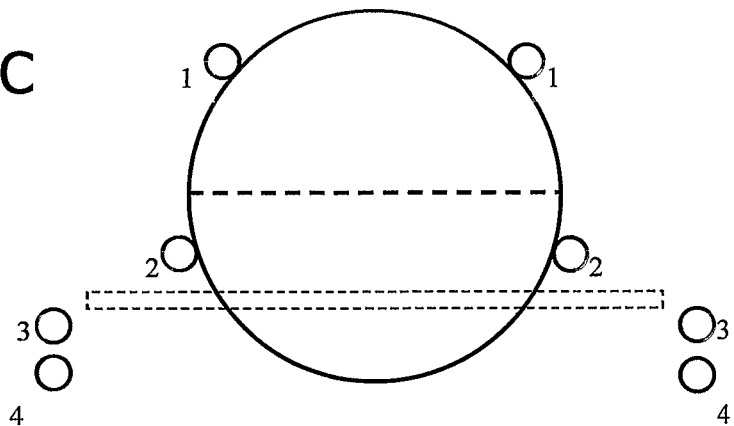

FIG. 6 schematically illustrates major components in a first preferred embodiment of scrubber-type cleaning apparatus according to a second aspect of the present invention;

FIG. 7 schematically illustrates a variant of the scrubber-type cleaning apparatus of FIG. 6;

FIG. 8 schematically illustrates major components in a second preferred embodiment of scrubber-type cleaning apparatus according to the second aspect of the present invention;

FIG. 9 schematically illustrates major components in a third preferred embodiment of scrubber-type cleaning apparatus according to the second aspect of the present invention;

FIG. 10 schematically illustrates a first supporting arrangement for a wafer or the like, in which FIGS. 10A to 10C show different positions of the wafer; and FIG. 11 schematically illustrates a second supporting arrangement for a wafer or the like, in which FIGS. 11A to 11D show different positions of the wafer.

A first aspect of the present invention, relating to scrubber-type cleaning 30 methods and apparatus that are designed to reduce the difference in cleaning performance across a wafer or the like, will now be described.

Figure 4A:
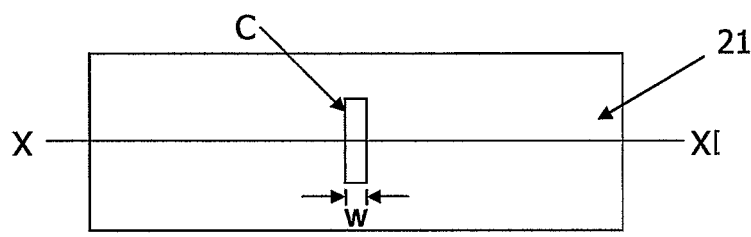
FIG. 4A is a side view of the brush.
Figure 4B:
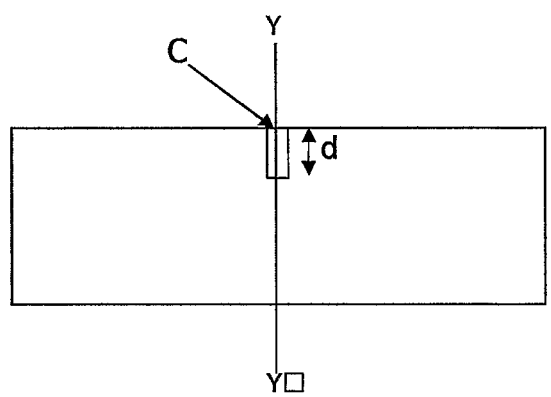
FIG. 4B is a cross-section taken along line X-X' of FIG. 3A.
Figure 4C:
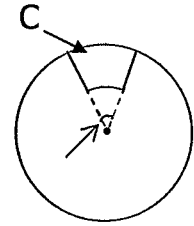
FIG. 4C is a cross-section taken along line Y-Y' of FIG. 3B.

In a first preferred embodiment of the invention according to its first aspect, the conventional brush used in a scrubber device is replaced by a brush having a new type of shape, as illustrated in FIG. 4. FIG. 4A shows a side view of one embodiment of the new brush, whereas FIG. 4B shows a cross-section along line X-X' of FIG. 4A, and FIG. 4C shows a cross-section along line Y-Y' of FIG. 4B. The new brush may be made using the same materials as conventional scrubber brushes.

Traditional scrubber brushes are cylindrical in shape. As can be seen in FIG. 4, the present embodiment of the invention makes use of a brush which has a generally cylindrical shape but, at a location where the scrubber brush would normally make continuous contact with the central region of a wafer being cleaned, there is a cavity C at the periphery of the brush. This cavity produces a non-contact region where the brush will not make contact with the central portion of the wafer being cleaned. Generally, this non-contact region will be positioned approximately halfway along the length of the cylinder.

As can be seen from the cross-sectional view shown in FIG. 4C, the non-contact region extends only a certain distance around the circumference of the brush so as to ensure that, during each rotation of the brush, the centre of the wafer being cleaned is in contact with the brush surface for a certain fraction of the time, instead of being in continuous contact as in conventional scrubbing apparatus. Preferably, the dimensions of the cavity C are selected so as to ensure that all radii of the wafer are in contact with the brush for substantially the same amount of time.

According to the present embodiment of the invention, the cavity C in the brush should have a depth, d, sufficient to ensure that there is no contact between the central region of the wafer (or the like) undergoing cleaning and the brush surface at this location, bearing in mind the pressure likely to be applied between the brushes and the wafer (or the like) during cleaning. A suitable depth will generally be between 0.5 and 5 mm.

In order to avoid the creation of stresses in the wafer, or differences in friction acting on the front and rear surfaces thereof, it is preferable to use a pair of brushes according to FIG. 4 (arranged as the brushes in FIG. 1) to clean the front and rear surfaces of the wafer simultaneously, as well as to synchronise rotation of the brushes so that when the non-contact portion of one of the brushes faces towards the front of the wafer, the non-contact portion of the other brush is facing the rear surface of the wafer at the same moment).

As illustrated in FIG. 3, the side walls of the cavity C in the brush are substantially perpendicular to the cylindrical outer surface of the brush, and these side walls are substantially perpendicular to each other and to the base of the cavity (thus defining a rectangular-section cavity in a first plane and a sector-section cavity in a second plane perpendicular to the first). However, the present invention is not limited to use of cavities of this form for providing a non-contact region between the brush's outer surface and the central region of a wafer or the like undergoing cleaning. More particularly, the cavity's side walls may be inclined so that the depth of the cavity is greatest at the cavity centre and gradually reduces towards the periphery of the cavity so as to minimize shear stress at the wafer's interface.

Figure 5A:
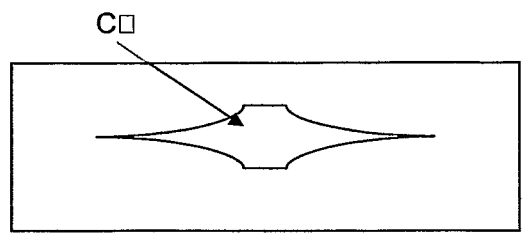
FIG. 5A illustrates a variant using a single cavity having tapering ends.

Moreover, different configurations of one or more cavities can be used in order to equalise the amount of time that the different parts of the wafer spend in contact with the brush surface. For example, as illustrated in FIG. 5A, even if a single cavity C' is provided in the brush surface, the width and/or depth of this cavity can vary along the axial direction of the brush (corresponding to the radial direction of the wafer). More especially, the width and/or depth of the cavity may be greatest in a region designed to make contact with radially-inner portions of the wafer, gradually reducing towards regions designed to contact radially-outer portions of the wafer, so that each spot on the wafer is in contact with the brush for the same amount of time.

Figure 5B:
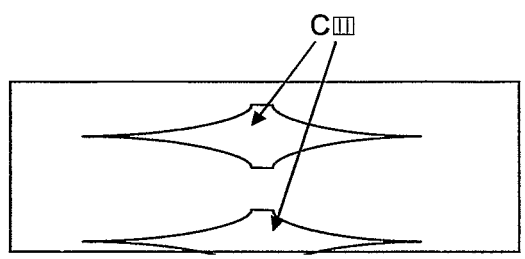
FIG. 5B illustrates a variant using a plurality of cavities having tapering ends.

Another variant is illustrated in FIG. 5B. According to this variant, instead of using a single cavity in order to equalize the contact time between the different regions of the wafer and the brush, a plurality of cavities C" are distributed around the circumference of the brush. In the example illustrated in FIG. 5B these cavities C" are shaped so as to taper in width from the centre of the wafer towards the radially-outer portions of the wafer, but other cavity shapes could be used.

Figure 5C:
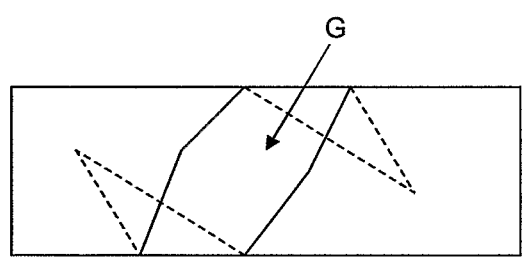
FIG. 5C illustrates a variant using a spiral groove having varying width.

Another possibility (illustrated in FIG. 5C) involves providing a non-contact region between the brush and the wafer using one or more spiral-shaped grooves G in the brush surface. The spiral-shaped groove (or grooves) G may be thin towards the ends of the brush (which will make contact with radially-outer portions of the wafer), becoming thicker and deeper towards the mid-point of the brush (which will make contact with the centre of the wafer), so as to maintain a constant time of contact between the brush and the different areas on the wafer.

Figure 5D:
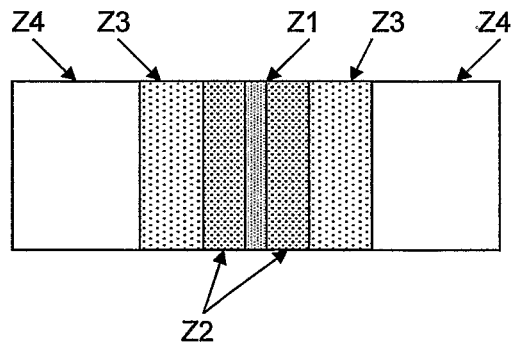
FIG. 5D illustrates a variant using cavities distributed with different densities in different zones of the brush surface.

Yet another possible configuration of the brush surface is illustrated in FIG. 5D. According to this variant, the surface of the brush is provided with a large number of cavities which reduce the contact between the brush and the wafer. The number of cavities is greatest in a first zone Z1 of the brush surface that is designed to make contact with the centre of the wafer, gradually reducing in zones Z2 and Z3 which will make contact with radially-outer areas on the wafer. The zones Z4 designed to make contact with the radially-outermost areas on the wafer may have no cavities.

In the variant of FIG. 5D the distribution of cavities in the brush surface changes in a discrete fashion in distinct zones of the brush surface, but this is not essential. The distribution of cavities could change continuously, or the size of the cavities could change (either discretely or continuously).

It should be noted that the cavity or cavities in the brush surface can have a variety of shapes, not limited to those illustrated in the accompanying drawings. Also, although it is preferred to arrange the pattern of cavities/grooves so as to equalize the contact time between the brush surface and all the different regions of the wafer, the present embodiment (and its variants) provides advantages even if the contact time is not equalized (provided that the differences in contact time are reduced). More specifically, the pattern of cavities/grooves may serve merely to reduce the contact time between the central portion of the wafer and the brush, rendering it closer to the contact time experienced by other portions of the wafer.

Furthermore, although the above-described first preferred embodiment according to the first aspect of the invention (and its variants) makes use of a pattern of cavities/grooves designed in view of the contact time between the brush and different portions of the wafer, the design of the pattern of cavities/grooves may be set so as to equalize the distribution of defects observed after the wafers have been cleaned (based on empirical observations of the defect distribution) and/or to minimize the overall number of defects.

A second embodiment according to the first aspect of the invention provides scrubber apparatus in which conventional brushes can still be used, but continuous contact between the central region of the wafer (or the like) and the brushes is prevented by introducing a relative translational movement between the brushes and the wafer.

More particularly, according to the present embodiment, the position of the wafer can be toggled up and down at a speed selected so as to ensure that the central region of the wafer (or the like) undergoes a sufficient degree of cleaning without being in continuous contact with the scrubber brushes. Alternatively, the desired translational motion can be achieved by toggling up and down the position of the brushes while the wafer (or the like) rotates at a fixed location. Preferably the amplitude of the translation of the wafer position relative to the global position of the brushes is up to about one third of the wafer's diameter in each of two opposed directions. The translational motion should have a speed of between 0.1 to 10 cycles per second. If the wafer is rotating with an orbital motion the rotational speed should be between 10 to 600 rpm.

A third embodiment according to the first aspect of the invention also provides scrubber apparatus in which conventional brushes can still be used, but cleaning performance across the wafer (or the like) is rendered more even by altering the fluid dynamics in the apparatus. According to the present embodiment, a new mechanism is used for dispensing chemicals onto the surface of the wafer (or the like).

Figure 1:
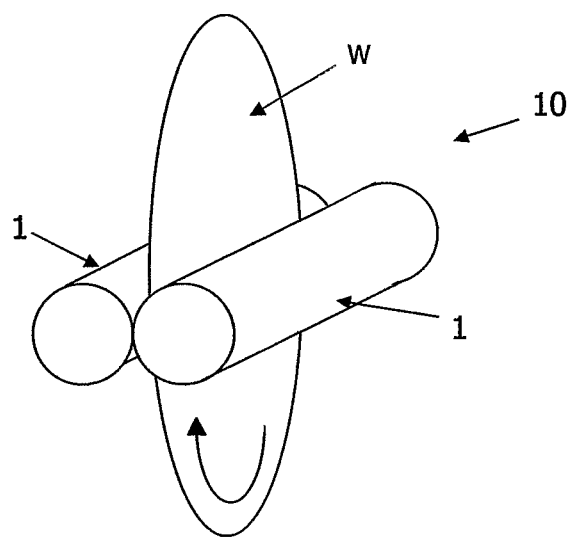
Figure 3A:
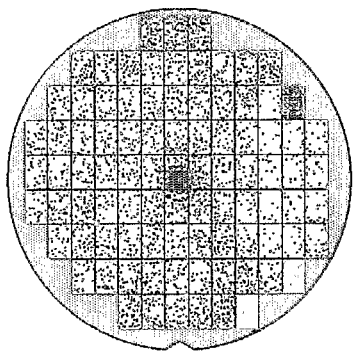
FIG. 3A shows a defect map of the entire wafer.
Figure 3B:
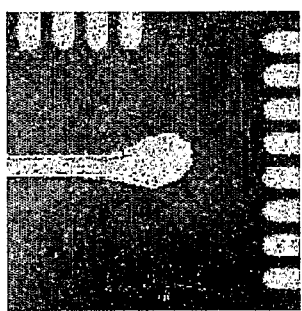
FIGS. 3B to 3D show corrosion defects at the centre of the wafer.
Figure 3C:
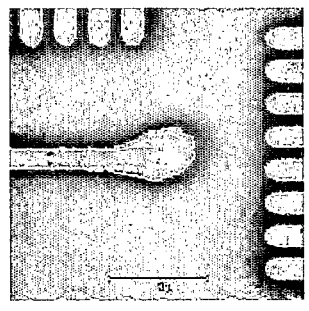
Figure 3D:
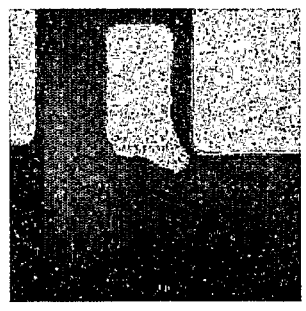
Figure 2:
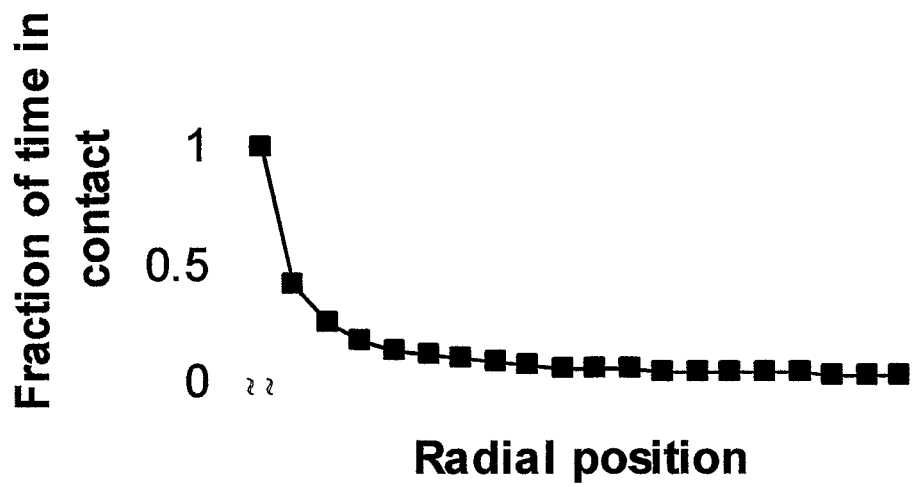
FIG. 2 is a graph indicating how the fraction of the time a given wafer portion is in contact with a cleaning brush varies with the radial position on the wafer when using a conventional wafer-cleaning device as illustrated in FIG. 1.

In conventional scrubbing apparatus, cleaning fluid(s) are provided on the wafer surface either using a dispensing mechanism which causes the cleaning fluid(s) to be dispensed through the brushes or using a dispensing mechanism which sprays cleaning fluid(s) onto the surface of the wafer from vertical spray bars/nozzles, that is, spray bars/nozzles located above the wafer, aligned with the wafer and ejecting cleaning fluid(s) vertically downwards, when the wafer is oriented for example as shown in FIG. 1.

According to the present embodiment of the invention, a new dispensing mechanism is used which, on both sides of the wafer, directs the cleaning fluid towards the centre of the wafer. The cleaning fluid(s) can be provided through single or multiple nozzles, with multiple nozzles typically being mounted on a spray manifold. In the case of using a spray manifold, the angle of the nozzle(s) is typically between 30 and 90 degrees relative to the wafer's major surface. Advantageously, according to the present embodiment the location on the wafer surface at which the cleaning chemical(s) make impact is optimized to create a uniform distribution of the chemical(s) over the surface and/or to minimize defectivity on the cleaned wafer. Typically, the nozzle(s) will be located above the wafer, but they may be located at other positions.

A second aspect of the present invention relates to cleaning methods and apparatus that are designed to reduce re-contamination and scratching of the surface of the wafer or the like undergoing cleaning and will now be described with reference to FIGS. 6 to 11.

In the preferred embodiments of the invention according to its second aspect, the conventional brushes used in a scrubber device are replaced by rollers and a web of cleaning material. The rotating rollers do not make contact with the wafer (or the like) undergoing cleaning, instead the web of cleaning material is fed between the rollers and the wafer (or the like) so that a clean surface of this cleaning material contacts and removes foreign matter from the surface of the wafer (or the like). There is relative motion between the wafer and the point of contact of the cleaning material with the wafer. The rollers apply pressure to the wafer through the cleaning material and assure mechanical cleaning.

A first preferred embodiment of the invention according to its second aspect will now be described with reference to the cleaning apparatus 100 of FIG. 6. In this embodiment, the wafer (or the like) to be cleaned is fed between a pair of opposing rollers 110. The rollers 110 rotate in opposite directions, like the brushes in conventional scrubber apparatus.

Each roller 110 is associated with a mechanism for feeding a respective web of cleaning material 116 which, as shown in FIG. 6, can be a web of tissue. Preferably, the tissue is made of a soft polymer composite, such as PVA or polyurethane, having specified values for surface parameters such as zeta potential, surface functionality and electrical charge. The web of cleaning material 116 may be made from the same materials as are commonly used to make the surfaces of conventional cleaning brushes. In that way it can be ensured that the tissue will not dissolve in the cleaning fluid(s).

More particularly, the web of tissue is supplied from a supply reel (fresh tissue drum) 112, wound around a portion of the surface of the roller (at a location where the two rollers oppose each other), and wound-up onto a take-up reel (used tissue drum) 114. The supply reel 112 and take-up reel 114 rotate, and their rotational speed can be set such that the rate of feeding of the cleaning material can be different from the rate of rotation of the rollers. In one embodiment, it is only the take-up reel 114 which is driven in rotation and sets the speed of feeding of the web of cleaning material.

During use, a wafer W (or the like) is fed between the rollers 110 as they rotate. However, at the location where the rollers oppose each other, the wafer (or the like) comes into contact with the two webs of cleaning material 116 wound on the roller surfaces, rather than coming into contact with the surfaces of the rollers themselves. In the region of contact between the wafer (or the like) and the web of cleaning material 116, the cleaning material is moving in the opposite direction to the wafer.

The rollers have adjustable spacing which is set to a value which ensures that the webs of cleaning material are pressed against the wafer (or the like) undergoing cleaning. Typically, the inter-roller spacing will be between 0 and 3 mm. The rollers also have loading springs (not shown) which enable a force to be applied to the wafer (or the like) in a direction substantially tangential to the roller surface at the location where the cleaning material makes contact with the wafer surface. The vertical force from the rollers produces a controllable non-zero coefficient of friction between the cleaning material and the wafer. Typically, the coefficient of friction will be greater than zero and up to about 15 kg/cm$^2$. Together with the relative motion between the wafer surface and the cleaning material, this results in shear forces acting on the particles of foreign matter adhering to the wafer surface. These shear forces tend to remove the particles of foreign matter from the wafer surface.

Because the web of cleaning material 116 is continuously fed from the supply reel, the wafer surface always makes contact with a clean portion of the cleaning web. The portion of the cleaning web which has made contact with the wafer surface, and removed foreign matter therefrom, is carried away from the wafer and wound up onto the take-up reel 114. Therefore, the possibility of recontamination or scratching of the wafer surface by removed foreign matter is eliminated.

In the present embodiment, it is preferred to make use of cleaning fluids as well as the web of cleaning material in order to clean the surface of the wafer (or the like). The cleaning fluid(s) can be deionized water and/or one or more suitable chemicals (as mentioned above). These cleaning fluids can be dripped or sprayed onto the rollers from pipes 118 of a dispensing mechanism, for example as shown in FIG. 6. Alternatively, the cleaning fluid(s) can be dispensed through the rollers 110.

Yet other possibilities for dispensing the cleaning fluid(s) involve: the cleaning fluid(s) being dispensed directly onto the wafer surface (by a suitably located dispensing mechanism), or the cleaning fluid(s) being applied to the web of fresh cleaning material (i.e. before it makes contact with the item to be cleaned), or the cleaning fluid(s) being dispensed onto the interface between the cleaning material and the item undergoing cleaned (e.g. by providing pipes at location indicated by dashed lines in FIG. 6). In one variant, the cleaning fluid(s) is (are) already present at the supply reel and is (are) applied to the web of cleaning material as or before it leaves the supply reel, for example by providing the supply reel inside a drum-shaped housing and loading the drum with cleaning fluid(s).

It is preferred if the web of cleaning material used in this embodiment is an absorbent material provided on an impermeable carrier web (e.g. a tape made of plastics material). The advantage of this variant 150 can be better understood from a consideration of FIG. 7.

As shown in FIG. 7, when the web of cleaning material 166 comprises an absorbent material provided on an impermeable backing, this web is orientated such that the impermeable backing faces the roller surface and the absorbent material faces the surface to be cleaned. Before passing in-between the rollers 160 and the wafer surface to be cleaned, the web of cleaning material 166 absorbs cleaning fluid(s)—this can be achieved, for example, by virtue of providing cleaning fluid(s) within the supply drum which feeds out the web of cleaning material. In this variant, the spacing between the rollers 160 is set such that the cleaning material is compressed as it enters the gap between the roller and the wafer. When the cleaning material is compressed, the absorbent material releases the cleaning fluid(s) onto the wafer surface.

As the cleaning material leaves the gap between the roller 160 and the wafer W, it expands again and reabsorbs cleaning fluid(s) which are now loaded with foreign matter that has been removed from the wafer surface. Because the web of cleaning material has an impermeable backing layer arranged to face the rollers, the cleaning fluid loaded with removed particles is prevented from reaching the rollers and contaminating the surfaces thereof.

The first preferred embodiment according to the second aspect of the present invention makes use of webs of cleaning material in order to remove foreign matter from the surface of a wafer or the like. At all times it is a fresh portion of the cleaning material that contacts the surface of the wafer (or the like) so as to ensure that the removed foreign matter is not re-deposited onto that surface. Moreover, a relatively simple arrangement enables double-sided cleaning to be performed. In other words, both major surfaces of the wafer (or the like) are cleaned substantially simultaneously.

Furthermore, when the web of cleaning material is close to being used up a known type of end-of-tape sensor (not shown) can be used to detect this fact and to produce an appropriate alarm output. This enables a fresh reel of cleaning material to be fetched and the start end thereof to be attached to the terminating end of the previous reel of cleaning material. Thus, the time taken to change over from one web of cleaning material to the next is relatively small and lengthy procedures, such as separation of the rollers and re-calibration of the inter-roller spacing, are avoided.

The present embodiment can be implemented in such a way that the wafer is brought into contact with a plurality of different webs, one after the other. For example, the present embodiment can be implemented using multiple sets of the apparatus 100 shown in FIG. 6: a first set of apparatus 100 constituting a wetting station, the next set constituting a cleaning station, and the third set constituting a drying station. The wafer W is simply transported through the various stations in the desired order.

A second preferred embodiment according to the second aspect of the present invention will now be described with reference to the cleaning apparatus 200 of FIG. 8. This second preferred embodiment makes use of two continuous webs of cleaning material 216 for removing foreign matter from both major surfaces of a wafer or the like.

As can be seen in FIG. 8, the two continuous webs of cleaning material, 216, are pressed against a wafer (or the like) to be cleaned, using two pressure rollers, 210. These pressure rollers 210 are substantially identical to the rollers 110, 160 used in the preceding embodiments (of FIGS. 6 and 7) and so will not be described in detail here. Each continuous web of cleaning material is also passed over an additional pair of feeding rollers, 212, 214, which maintain a desired running path and running speed for the webs of cleaning material. Typically, the running speed of the webs of cleaning material is in the range 0 to 100 m/minute whereas a wafer would take between 20 and 90 seconds to pass through the unit.

In this embodiment it is advantageous if the cleaning material of each web 216 is formed of a porous tissue material which, once again, may be made of PVA or polyurethane for example, and is loaded with cleaning fluid(s) at the time when it is brought into contact with the wafer (or the like) to be cleaned. The porous tissue material may have charged surface functionality in order to trap particles.

When the cleaning material is pressed against the surface of a wafer (or the like) it removes foreign matter therefrom and carries it away. The cleaning material then passes over the lower feed roller 214 and passes to a belt conditioner, 220, which rubs against the surface of the cleaning material in order to revive it. This belt conditioner can consist of a diamond disc which is brought into contact with the surface of the cleaning material either after every wafer pass or at predetermined intervals. Typically, 0 to 5 µm of the cleaning material's surface is removed for every wafer pass.

The importance of this reviving of the contact surface of the continuous web of cleaning material (that is, the surface thereof which makes contact with the wafer to be cleaned) is, as follows:

it prevents particles from becoming embedded in the surface of the cleaning material (which, otherwise, would cause scratching of the next surface to be cleaned), and it ensures that, on each pass, the cleaning material has a contact surface which is sufficiently rough to remove foreign matter effectively.

Alternatively, in a case where the cleaning material has charged surface functionality, particles can be removed therefrom as follows: the tissue is washed in an environment having a pH adapted to reverse the zeta potential of the tissue, the particles are no longer attracted to the tissue and so are removed by the washing process.

After the contact surface of the cleaning material has been revived by the belt conditioner, the running path of the continuous web carries the revived portion through a rinsing station, 222. In this rinsing station 222, the web of cleaning material 216 is subjected to a continuous flow of rinsing fluid in order to extract from it the particles that have been removed from the wafer surface as well as the now-contaminated cleaning fluids that have been used to remove foreign matter from the wafer surface during the last cleaning pass. Alternatively, the rinsing fluid may be applied in a pulsed fashion. The rinsing station 222 is arranged to cause the rinsing fluid(s) to pass through the porous cleaning material, for example by being directed in a direction substantially perpendicular to the surface of the web 216. The rate of flow of the rinsing fluid(s) will typically be between 20 and 1000 ml per minute.

The rinsing fluid(s) may consist of deionized water or any suitable rinsing fluid (including particular cleaning fluids) adapted to extract the particles and contaminated cleaning fluid(s) from the web of cleaning material. It can be advantageous to use a rinsing fluid which neutralizes the electrical charge of the particles removed from the wafer. For example, if the cleaning fluid used during removal of particles from the wafer is TMAH (tetramethylammonium hydroxide) then a substance such as citric acid could be used as the rinsing fluid (and vice versa).

After passing through the rinsing station 222, the continuous web of cleaning material 216 passes through a drying station 224. In the drying station 224, excess fluid is removed from the cleaning material in order to ensure that there will be little or no dilution of cleaning fluid(s) that are subsequently applied to the web of cleaning material. The excess fluid can be removed from the web by any convenient means, for example by causing air to pass through the web under the effect of suction. If air is passed through the web in order to remove excess fluid, it is nevertheless preferred if this air is humidified so as to ensure that the web does not dry out completely; this helps to ensure that any particles remaining on the surface of the cleaning web do not become chemically bonded to that surface (which could lead to scratching of the wafers being cleaned).

After the cleaning material has been treated in the drying station 224, its running path brings it through a loading station 226 in which it is loaded with one or more cleaning fluids. Conventional cleaning fluids can be used, for example: the non-fluorinated, alkaline product ESC784, produced by ATMI; C100 produced by Wako Pure Chemical Industries, etc. The cleaning chemical(s) are applied to the web of cleaning material 216 by being caused to flow through the web in a similar way to the application of the rinsing fluid(s).

After leaving the loading station 226, the web of cleaning material 216 passes over the upper feed roller 212 where it is directed towards the zone of contact with the wafer (or the like), between the pressure rollers 210.

In common with the first preferred embodiment according to the second aspect of the invention, this second preferred embodiment allows the surface of a wafer or the like to be cleaned using a fresh cleaning surface (in this case, the revived surface of the continuous web of cleaning material). This avoids the problems of wafer-recontamination and wafer-scratching which afflict conventional scrubber-type cleaning apparatus.

A third preferred embodiment according to the second aspect of the present invention will now be described with reference to the cleaning apparatus 300 of FIG. 9. In this third preferred embodiment, the surface of a wafer (or the like) is cleaned using a web bearing an adhesive material on the contact surface thereof.

As seen in FIG. 9, in this embodiment, the webs of cleaning material 316 can be tapes bearing an adhesive layer on the surface thereof. Each tape is brought into contact with a respective major surface of the wafer W (or the like) using a pair of rollers 310. The rollers 310 can be substantially identical to those used in previous embodiments of the invention and so will not be described in detail here. As the adhesive material is pressed against the wafer, particles of foreign matter present on the wafer surface stick to the adhesive material and are pulled off the wafer.

Clearly, the adhesive material and its carrier tape must be selected such that the force of adhesion between the adhesive material and the carrier tape is greater than the bonding forces between the adhesive material and any matter it encounters on the surface of the wafer (or the like). If this were not so then the adhesive material could become stuck on the wafer surface. Suitable adhesive materials include: acrylic, rubber or synthetic rubber based adhesives. Typical carriers include polyethylene, polypropylene or polyester tapes. Numerous versions of these adhesives and carrier tapes are manufactured by the company 3M, including high-strength, high-bond, high-track and ultra-clean versions manufactured by 3M.

As illustrated in FIG. 9, the wafer (or the like) undergoing cleaning is held stationary while the rollers 310 rotate and are translated relative to the wafer. In this arrangement, each cleaning tape is also held stationary while the rollers move downwards (in FIG. 9) pressing a fresh portion of adhesive-coated tape against successive portions of the wafer surface. Once the whole wafer surface has been treated, the spacing between the rollers 310 is increased so as to retract them from the wafer surface. This allows the wafer to be removed and another wafer to be put into position for cleaning. Meanwhile, the cleaning tapes are advanced so as to bring fresh portions thereof into position at either side of the next wafer to be cleaned.

When the next wafer and the fresh portions of the cleaning tapes are in position, the rollers 310 are brought back towards each other and caused to rotate while being translated relative to the next wafer to be cleaned. This causes successive portions of the adhesive material on the cleaning tapes to be pressed against successive portions of the surface of the next wafer. The apparatus can be arranged such that the rollers 310 move in the same direction during all cleaning operations (e.g. downwards, as shown in FIG. 9). Alternatively, the apparatus could be arranged such that the rollers move downwards on one cleaning pass and upwards on the next cleaning pass, and so on in an alternating fashion.

Instead of translating the position of the rollers 310 relative to the wafer W (or the like), it is also possible to support the rollers such that they rotate at a fixed location and to move the wafer through the cleaning apparatus. This can be achieved using a number of different arrangements, as will be described in detail below. However, it should be noted there that, In the case where the rollers 310 of this embodiment rotate at a fixed location and the wafer is translated through the cleaning apparatus, the cleaning tape is run through the apparatus, for example, using feed rollers in a configuration similar to that of FIG. 6.

According to the second aspect of the present invention, it is necessary for the cleaning material's point of contact with the wafer surface to undergo a translational motion relative to the wafer, so that the whole surface of the wafer is cleaned. In all embodiments according to the second aspect of the invention, this motion can be produced by translating the global position of the rollers (for example, as illustrated in FIG. 9). Alternatively, the global position of the wafer can be translated so that it passes between the rollers. However, in both cases, because the roller is wider than the wafer it is necessary to adopt a support arrangement for the wafer which will ensure that the support structure itself does not impact the rollers during the relative translation between the rollers and wafer.

FIG. 10 shows a first arrangement that can be used for translating a wafer (or the like) through a scrubber-type cleaning apparatus as described above in connection with FIGS. 6 to 9. In order to aid understanding, in FIG. 10 only one of the pair of rollers is shown, and the position thereof is indicated using dashed lines. A heavier dashed line marks a position halfway up the wafer.

As shown in FIG. 10, the wafer is supported using a group of capstans. In this example, four pairs of capstans are used and each pair of capstans is labelled with a respective number from 1 to 4.

In this example, first of all the wafer is lined up beneath the cleaning apparatus, in a plane lying between the two rollers. The whole group of capstans is supported, for example using a support frame (not shown), which translates the global position of the group of capstans upwards as shown in FIG. 10, thereby moving the wafer upwards between the rollers.

The wafer is supported only by the lower two pairs of capstans, pair 3 and pair 4, as it is carried towards the rollers and arrives in the region between the two rollers. The uppermost pairs of capstans, pair 1 and pair 2, are held away from the wafer edge, as shown in FIG. 10A. The uppermost pair of capstans, pair 1, is separated so that the capstans of this pair can move around the ends of the rollers.

As the wafer advances further through the cleaning apparatus, the second pair of capstans, pair 2, is separated so that the capstans in this pair can move around the ends of the rollers (see FIG. 10B). Meanwhile, the uppermost pair of capstans, pair 1, has now cleared the rollers and is caused to contact the wafer edge.

When the wafer has advanced yet further, the second pair of capstans, pair 2, is brought into contact with the wafer edges at a position below the midpoint of the wafer. The wafer is now supported on the second pair of capstans, pair 2, and its position is stabilized by the first pair of capstans, pair 1. The lowermost two pairs of capstans, pair 3 and pair 4, can now be separated so as to avoid hitting the rollers.

The arrangement illustrated in FIG. 10 has the advantage that specific pairs of capstans are dedicated to handling the wafer before and after cleaning. In other words, capstan pair 1 and pair 2 only make contact with the wafer after it has been cleaned, whereas capstan pair 3 and pair 4 make contact with the wafer before cleaning. This further reduces the risk of re-contamination of the wafer after cleaning.

FIG. 11 shows a second arrangement that can be used for translating a wafer (or the like) through a scrubber-type cleaning apparatus as described above in connection with FIGS. 6 to 9. Once again, in this example the wafer is supported using four pairs of capstans.

In the example illustrated in FIG. 11, all of the pairs of capstans are biased towards the wafer edge and support the wafer, except for times at which they must be separated in order to avoid contact with the rollers.

Figure 11A:
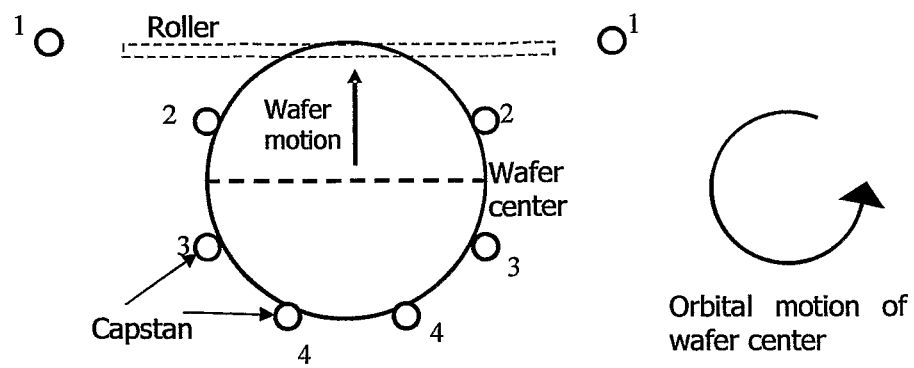

In this example, the wafer is supported by all the capstans as it is carried towards the rollers. As the top edge of the wafer arrives in the region between the two rollers, the uppermost pair of capstans, pair 1, separates so as to allow the capstans of this pair, to clear the ends of the rollers. As shown in FIG. 11A, the wafer is supported by pairs 2 to 4 of the capstans at this time.

Figure 11B:
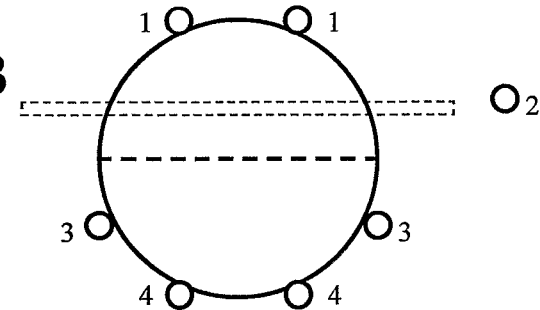

As the wafer advances further through the cleaning apparatus, the second pair of capstans, pair 2, is separated so that the capstans in this pair can move around the ends of the rollers (see FIG. 11B). Meanwhile, the uppermost pair of capstans, pair 1, has now cleared the rollers and is caused to contact the wafer edge.

Figure 11C:
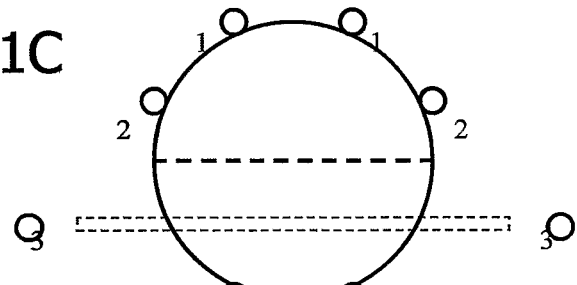

Similarly, when the wafer has advanced yet further, such that the midpoint thereof has passed beyond the rollers, the third pair of capstans, pair 3, is separated so that the capstans in this pair can move around the ends of the rollers (see FIG. 11C). Meanwhile, the second pair of capstans, pair 2, has now cleared the rollers and is caused to contact the wafer edge. The lowermost pair of capstans, pair 4, is still in contact with and supporting the wafer.

Figure 11D:
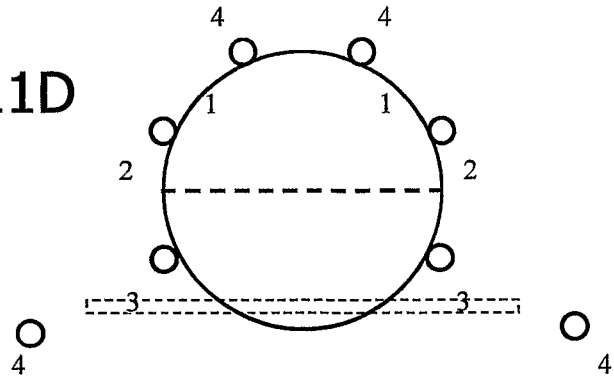

When the third pair of capstans, pair 3, has cleared the rollers and moved back to contact the wafer edge at a position below the midpoint thereof, the lowermost pair of capstans, pair 4, separates so as to avoid impact with the rollers, as shown in FIG. 11D.

In the arrangement illustrated in FIG. 11, the capstans make contact with the wafer edge before and after cleaning, so that there is a possibility of recontamination of the clean wafer surface. However, the risk of recontamination is small and this arrangement has the advantage that the wafer is supported by a greater number of capstans at all times.

Moreover, in the arrangements of FIGS. 10 and 11, it would be possible to equip each capstan with a cleaning arrangement whereby a web of cleaning material is fed around the capstan so that it is the cleaning material and not the capstan itself that makes contact with the wafer edge (in a similar configuration to the web of cleaning material used to clean the wafer itself).

In both of the above arrangements, it is advantageous if the capstans rotate so as to impart a rotation to the wafer. In this case the wafer undergoes a rotation as well as a translation relative to the point of contact thereof with the cleaning material. The resulting orbital motion of the wafer centre (indicated in FIG. 11) promotes more efficient cleaning because the particles of foreign mater on the wafer surface experience shear forces in different directions.

The arrangements of FIGS. 10 and 11 have been described for the case where the wafer undergoes a translation relative to the rollers (which rotate in a fixed position). It will be readily understood that the arrangements of FIGS. 10 and 11 can be used to prevent contact between the wafer's support structure and the rollers in the case where it is the rollers which undergo a translation, with the wafer being at a fixed location.

It should be noted that the scrubber-type cleaning arrangements of the present invention are well-adapted for cleaning of rigid plate-type objects, such as semiconductor wafers, which can be broken if they are subjected to excessive transverse forces (that is forces acting in a direction that is substantially perpendicular to the plane of their major surfaces). Moreover, the arrangements according to the present invention provide double-sided cleaning.

Although the present invention has been described above with reference to certain particular preferred embodiments, it is to be understood that the invention is not limited by reference to the specific details of those preferred embodiments. More specifically, the person skilled in the art will readily appreciate that modifications and developments can be made in the preferred embodiments without departing from the scope of the invention as defined in the accompanying claims.

For example, the figures show embodiments of the present invention using scrubber apparatus arranged in a vertical configuration. It is to be understood that the present invention also encompasses horizontal configurations.

Furthermore, although certain figures show a particular direction for a translational movement between rollers and a wafer in a cleaning apparatus, it is to be understood that the direction of the relative translation is not critical, provided that it is set such that the whole surface of the wafer undergoes cleaning.

Moreover, it is to be understood that, in the arrangements of FIGS. 8 and 9, the numbers of pairs of capstans used may be different from four.

Additionally, although the preferred embodiments of the invention have been discussed in terms of the cleaning of a semiconductor wafer, it is to be understood that the present invention is applicable more generally to the cleaning of circuit substrates and the like that have a rigid plate-like configuration, especially such items having a disc-like shape.

The invention claimed is

1. A circuit substrate cleaning apparatus comprising:
a pair of elongate rollers arranged such that curved surfaces thereof oppose each other across a gap, each roller being rotatable about its longitudinal axis and the outer curved surface of each roller being adapted for cleaning; and
circuit substrate support means for supporting and rotating a circuit substrate between, and in contact with, the rollers, the circuit substrate support comprising at least four pair of capstans, each capstan of each pair of capstans being movable between a first position in contact with the edge of the circuit substrate and a second position spaced apart from each other by a distance sufficient to pass around the pair of elongated rollers, at least two pairs of capstans of the plurality of pairs of capstans concurrently in contact with the circuit substrate when the pair of elongated rollers is in contact with the circuit substrate;
characterized by comprising compensating means adapted to reduce inequalities in cleaning across a radial direction of the circuit substrate; wherein the compensating means comprises means for moving the circuit substrate relative to the rollers in the radial direction of the circuit substrate while the circuit substrate is being supported and rotated between the rollers.

2. Circuit substrate cleaning apparatus according to claim 1, wherein the compensating means comprises one or more non-contact regions provided in the curved surfaces of the rollers at a location arranged to face said central region of a circuit substrate being supported between the rollers.

3. Circuit substrate cleaning apparatus according to claim 1, wherein the compensating means comprises means for directing cleaning fluid towards said central region of the circuit substrate while the circuit substrate is being supported and rotated between the rollers.

4. Circuit substrate cleaning apparatus comprising:
a pair of elongate rollers arranged such that curved surfaces thereof oppose each other across a gap, each roller being rotatable about its longitudinal axis;
circuit substrate support means for supporting a circuit substrate in the gap between the rollers; and
feeding means for feeding a web of cleaning material between one of said rollers and a circuit substrate supported in the gap between the rollers such that, in use, the cleaning material contacts said circuit substrate;
wherein the support means is configured to reduce inequalities in cleaning across the radial direction of the circuit substrate;
wherein:
the rollers are wider than the circuit substrate to be cleaned; and
the circuit substrate support means comprises a plurality of pairs of capstans, the capstans of each pair being movable between a first position in contact with the edge of the circuit substrate and a second position spaced apart from each other by a distance sufficient to pass around the rollers, at least two pairs of capstans of the plurality of pairs of capstans concurrently in contact with the circuit substrate when the web of cleaning material is in contact with the circuit substrate;
wherein the plurality of pairs of capstans or the rollers are configured to move the circuit substrate in a radial direction of the circuit substrate relative to the rollers to reduce inequalities in cleaning across the radial direction of the circuit substrate.

5. Circuit substrate cleaning apparatus according to claim 4, and further comprising dispensing means for applying cleaning fluid to at least one of said web of cleaning material and said circuit substrate.

6. Circuit substrate cleaning apparatus according to claim 4, wherein the feeding means is arranged to feed between a roller and a circuit substrate supported in the gap between the rollers a web of cleaning material comprising a layer of porous material and an impermeable backing tape, with the backing tape arranged to face towards the roller.

7. Circuit substrate cleaning apparatus according to claim 4, wherein the feeding means is arranged to feed between a roller and a circuit substrate supported in the gap between the rollers a web of cleaning material comprising a layer of adhesive material and a carrier tape, with the carrier tape arranged to face towards the roller.

8. Circuit substrate cleaning apparatus according to claim 4, wherein the feeding means comprises means for feeding a first web of cleaning material between a first one of said rollers and a first major surface of a circuit substrate supported in the gap between the rollers and means for feeding a second web of cleaning material between the second one of said rollers and the second major surface of said circuit substrate.

9. Circuit substrate cleaning apparatus according to claim 4, and comprising a surface-reconditioning station for reconditioning the surface of said web of cleaning material, wherein the feeding means is adapted to circulate a continuous loop of cleaning material along a path passing through the gap between the rollers and passing through the surface-reconditioning station.

10. Circuit substrate cleaning apparatus according to claim 9, and comprising a rinsing station for rinsing said web of cleaning material, wherein the feeding means is adapted to circulate the continuous loop of cleaning material along a path passing through said rinsing station.

11. Circuit substrate cleaning apparatus according to claim 4, wherein the circuit substrate support means is arranged such that the capstans impart a rotary motion to the circuit substrate being cleaned.

12. Circuit substrate cleaning apparatus according to claim 4, wherein said plurality of pairs of capstans comprises a first set of capstans adapted to contact the circuit substrate before the circuit substrate has made contact with the web of cleaning material and a second set of capstans adapted to contact the circuit substrate after the circuit substrate has made contact with the web of cleaning material.

13. Circuit substrate cleaning apparatus according to claim 4, wherein at least one pair of capstans of the at least two capstans is in contact with the circuit substrate on one side of the center line of the circuit substrate and at least one other pair of capstans of the at least two capstans with the circuit substrate on the other side of the center line of the circuit substrate when the web of cleaning material is in contact with the circuit substrate.

14. Circuit substrate cleaning apparatus according to claim 4, wherein the rollers translate relative to the circuit substrate and the plurality of pairs of capstans.

\* \* \* \* \*